United States Patent [19]

Fish et al.

[11] 4,029,976

[45] June 14, 1977

[54] AMPLIFIER FOR FIBER OPTICS APPLICATION

[75] Inventors: Franklin H. Fish; Rodney S. Katz, both of Indianapolis, Ind.

[73] Assignee: The United States of America as represented by the Secretary of the Navy, Washington, D.C.

[22] Filed: Apr. 23, 1976

[21] Appl. No.: 679,629

[52] U.S. Cl. .............................. 307/311; 307/229; 328/167
[51] Int. Cl.² ...................... H03K 3/42; H03D 1/00
[58] Field of Search ................ 307/311, 229, 230; 328/167; 333/70 CR; 250/552, 551, 432

[56] References Cited

UNITED STATES PATENTS

| 3,463,928 | 8/1969 | Murphy | 307/311 |
| 3,649,833 | 3/1972 | Leaf | 250/452 |
| 3,872,329 | 3/1975 | Dodson | 307/311 |

*Primary Examiner*—Stanley D. Miller, Jr.
*Assistant Examiner*—B. P. Davis
*Attorney, Agent, or Firm*—R. S. Sciascia; Paul S. Collignon

[57] ABSTRACT

An amplifier for use with a photodiode in an electro-optical transmission line. A transimpedance amplifier is connected to an output port of a photodiode and a T-network feedback circuit is provided as a feedback element in order to provide a significant increase in the transimpedance gain-bandwidth product.

6 Claims, 6 Drawing Figures

AMPLIFIER FOR FIBER OPTICS APPLICATION

CROSS-REFERENCES TO RELATED APPLICATIONS

Patent application of Franklin H. Fish, entitled, "High Speed Fiber Optic Communication Link", Ser. No. 570,927, filed Apr. 22, 1975.

Patent application of Franklin H. Fish, entitled, "Split-Path Receiver For Fiber Optics Application," Ser. No. 670,013, filed Mar. 24, 1976.

BACKGROUND OF THE INVENTION

The present invention relates to an amplifier circuit and more particularly to an amplifier circuit for accepting a low level, high impedance output signal from a photodiode and then amplifying this signal to a voltage and power level suitable for interfacing with standard circuitry while introducing a minimum of signal distortion.

One problem in transmitting information through standard electrical cables is the undesirable effect of radiated and conducted EMI (electro-magnetic interference) normally associated with these cables. Such EMI may, for example, cause spurious or other erroneous readings from equipment attached to the cable. One solution to this problem has been to convert the information to be transmitted from electrical energy to light energy, transmit the light energy signal through a light conducting cable such as, for example, a fiber optic bundle, and reconvert the light energy into electrical energy at the receiving end. Since the light conducting cable is not responsive to EMI, interference on the line is thus eliminated.

Fiber optic technology is being considered for future applications in two distinct areas of the data communication field. The first of these application areas, which is presently under intensive development, is concerned with the transmission of data over medium to long distances. Long distance data transmission utilizes low loss optical fiber, avalanche photodiode detectors with special low noise preamplifiers and bias stabilization circuits, thermoelectrically cooled laser diodes, and periodic repeater stages. Because of the potentially large commercial application for long distance optical data transmission, much privately sponsored research is directed towards this area. Medium and long distance optical communication links are also of considerable interest to the military departments.

The second area of development is concerned with the optical transmission of data over short distances of a few hundred meters or less. The advantages to be gained over the use of conventional wire cables include: high per channel data rate capability, immunity to electro-magnetic interference, lower cable weight, elimination of fire hazard due to electrical shorting, and potentially lower cost. For short length data link applications, multi-fiber bundles of medium and high loss fiber are utilized. Light emitting diodes (LED's) are employed as optical sources, and photodiodes are used for optical detection. Short distance optical data transmission is of particular interest to the military departments since this technology has been proposed for the optical wiring of aircraft where line lengths of 150 feet or less are encountered.

The technology required for the application of fiber optic data transmission systems to military equipment is in the early feasibility stage of development. At present, considerable effort is being expended towards defining and developing the components and systems needed for the implementation of fiber optics data links. Much progress is still required in all spects of fiber optics technology before reliable, large scale applications can be made to military systems.

The detection of "light" (visible or infrared radiation) signals in a fiber optics data transmission system is accomplished by use of a silicon photodiode. The photodiode is heavily reverse biased, and its equivalent circuit can be represented as a light dependent current source, shunted by the depletion layer capacitance. This simplified equivalent circuit would also include a small series resistance. In most fiber optic receiver applications, the diode signal current is fed directly into a transimpedance type amplifier. The diode output is terminated at the virtual ground created by the amplifier. If an ideal amplifier is assumed, the virtual ground point appears as a perfect short circuit to the diode. Under this hypothetical condition the frequency response of the receiver is determined by the photodiode short circuit response, and by the time constant of the amplifier feedback network. In the case of a real receiver, the less than ideal gain-frequency characteristics of the amplifier introduce some additional frequency response limitations.

In most applications, a feedback circuit is provided with the amplifier and a feedback resistance is provided which is made relatively large in order to achieve significant amplification. With this relatively large value of feedback resistance, only a few picofarads of shunt capacitance results in a sizable time constant.

The principal limitation of the common commercial circuit implementation is therefore due to conflicting requirements to make the feedback resistance large for reasons of gain, and at the same time as small as possible in order to meet bandwidth requirements. These constraints are imposed on the circuitry by the basic characteristics of the photodiode which are high output impedance and a low output signal current level. A tradeoff decision is required in the amplifier design between gain and bandwidth. An alternate approach to achieving large bandwidth response involves a lowering of the feedback resistance, and the utilization of a cascaded string of wide bandwidth amplifiers. This latter design approach is, however, complicated, expensive, and sensitive to environmental changes.

SUMMARY OF THE INVENTION

The present invention provides an amplifier for use with a photodiode in an electro-optical transmission line which will provide a significant increase in the transimpedance gain-bandwidth product. A T-network is provided as a feedback element and provides the increased gain-bandwidth product.

It is therefore a general object of the present invention to provide an improved amplifier circuit for use with a photodiode in an electro-optical transmission line.

Other objects, advantages and novel features of the present invention will become apparent from the following detailed description of the invention when considered in conjunction with the accompanying drawings.

DESCRIPTION OF THE PREFERRED EMBODIMENTS

Figure 1:
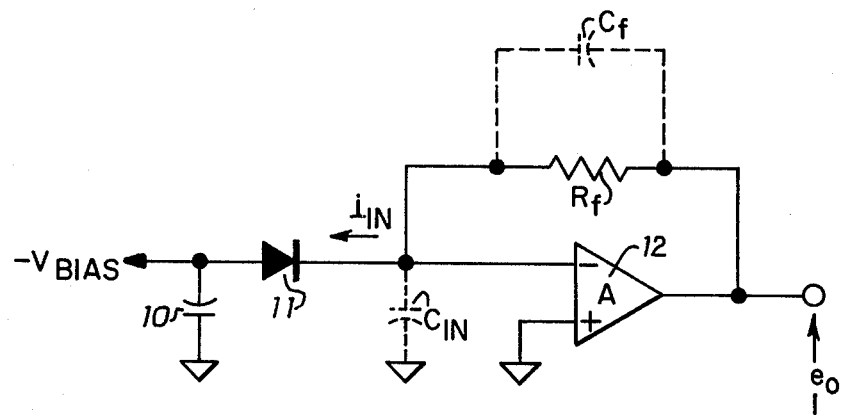
FIG. 1 is a circuit diagram showing a prior art arrangement for amplifying a signal current from a photodiode.

Referring now to the drawings, FIG. 1 shows a prior art fiber optic receiver application wherein a signal current from a diode 11 is fed directly into a transimpedance type amplifier 12. The diode output is terminated at the virtual ground created by the amplifier 12. If an ideal amplifier is assumed, the virtual ground point appears as a perfect short circuit to the diode. Under this hypothetical condition the frequency response of the receiver is determined by the photodiode short circuit response, and by the time constant of the amplifier feedback network. In the case of a real receiver, the less than ideal gain-frequency characteristics of the amplifier introduce some additional frequency response limitations. Equation 1 is a simplified expression for the transimpedance gain of the configuration of FIG. 1.

$$\frac{e_o}{i_{in}} = \frac{\left[\frac{A}{1+A}\right] R_f}{s R_f \left[C_f + \frac{C_{in}}{1+A}\right] + 1} \quad (1)$$

where, $A$ = open loop voltage gain, magnitude and phase
$R_f$ = feedback resistance
$C_f$ = total parasitic feedback capacitance
$C_{in}$ = total input capacitance ($C_{Diode} + C_{Amplifier} + C_{Wiring}$)
$s = \alpha + j\omega$ (LaPlace operator)

In most prior art applications, the feedback resistance $R_f$ is made relatively large (10K $\Omega$ to 200K $\Omega$) in order to achieve significant amplification. With this relatively large value of feedback resistance, only a few picofarads of shunt capacitance results in a sizable time constant $\tau$. For example, a 10K $\Omega$ feedback resistor in conjunction with 5 picofarads of stray capacitance limits circuit rise-time ($t_r$) to 110 nsec ($t_r = 2.2\ \tau$, where $\tau = RC$) and bandwidth to 3.2 MHz.

The principal limitation of the prior art circuit implementation is therefore due to conflicting requirements to make the resistance, $R_f$, large for reasons of gain, and at the same time as small as possible in order to meet bandwidth requirements. These constraints are imposed on the circuitry by the basic characteristics of the photodiode which are: high output impedance, and a low output signal current level. A tradeoff decision is required in the amplifier design between gain and bandwidths. An alternate approach to achieving large bandwidth response involves a lowering of the feedback resistance, and the utilization of a cascaded string of wide bandwidth amplifiers. This design approach is, however, complicated, expensive, and sensitive to environmental changes.

Figure 2:
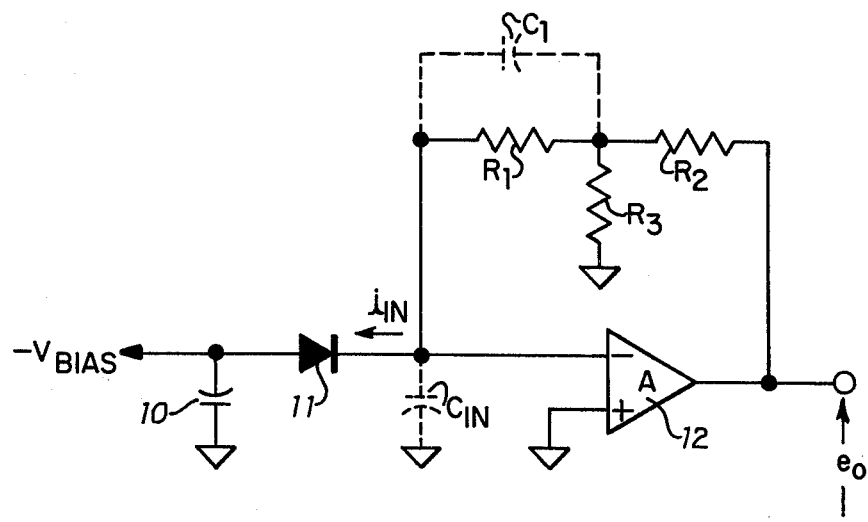
FIG. 2 is a schematic circuit diagram of one embodiment of the present invention.

Referring now to FIG. 2 of the drawings, there is shown an improved transimpedance amplifier 12 with a T-network as a feedback element. The resistive T-network is comprised of resistors $R_1$, $R_2$, and $R_3$. An analysis of the circuit configuration of FIG. 2 is:

$$\frac{e_o}{i_{in}} = \frac{\left[\frac{A}{1+A}\right] R_f' (s C_1 R_3 + 1)}{(s C_1 R_1 + 1)\left(s C_{in} \frac{R_2 R_1}{R_2 + R_3 (1+A)} + 1\right)} \quad (2)$$

where:

$$R_f' = R_1 \left(1 + \frac{R_2}{R_1} + \frac{R_2}{R_3}\right); \quad (3)$$

and the other parameters are as defined in Equation 1.

In the derivation of equation 2, a number of simplifying assumptions were made, including the assumption that:

4. $R_{in}$ (Amplifier) $> R_1 >> R_2, R_3$.

Equation 3 defines an effective transimpedance gain, $R_f$, in terms of the T-network resistors $R_1$, $R_2$, and $R_3$ and, for the general case $R_1$ is much greater than $R_2$. This simplifying assumption allows Equation 3 to be restated in reduced form as:

$$R_f' \cong R_1 \left(1 + \frac{R_2}{R_3}\right) \quad (5)$$

It can be seen, from the examination of Equation 5, that it is possible to choose values for $R_2$ and $R_3$ so that the transimpedance gain $R'_f$ is an order of magnitude larger than $R_1$.

Setting $R'_f$ of Equation 2 equal to $R_f$ of Equation 1 and comparing these two equations shows that the T-network circuit configuration shown in FIG. 2 of the drawings can maintain an equivalent transimpedance gain while, at the same time, reduce the bandwidth limiting time constants by a factor approximately equal to the ratio of $R'_f$ to $R_1$. The result is that a T-network designed to give the equivalent transimpedance gain of a single feedback resistor configuration provides increased bandwidth by a factor approximately equal to $$\frac{R_f'}{R_1} \text{ or } \left(1 + \frac{R_2}{R_3}\right).$$

Figure 3:
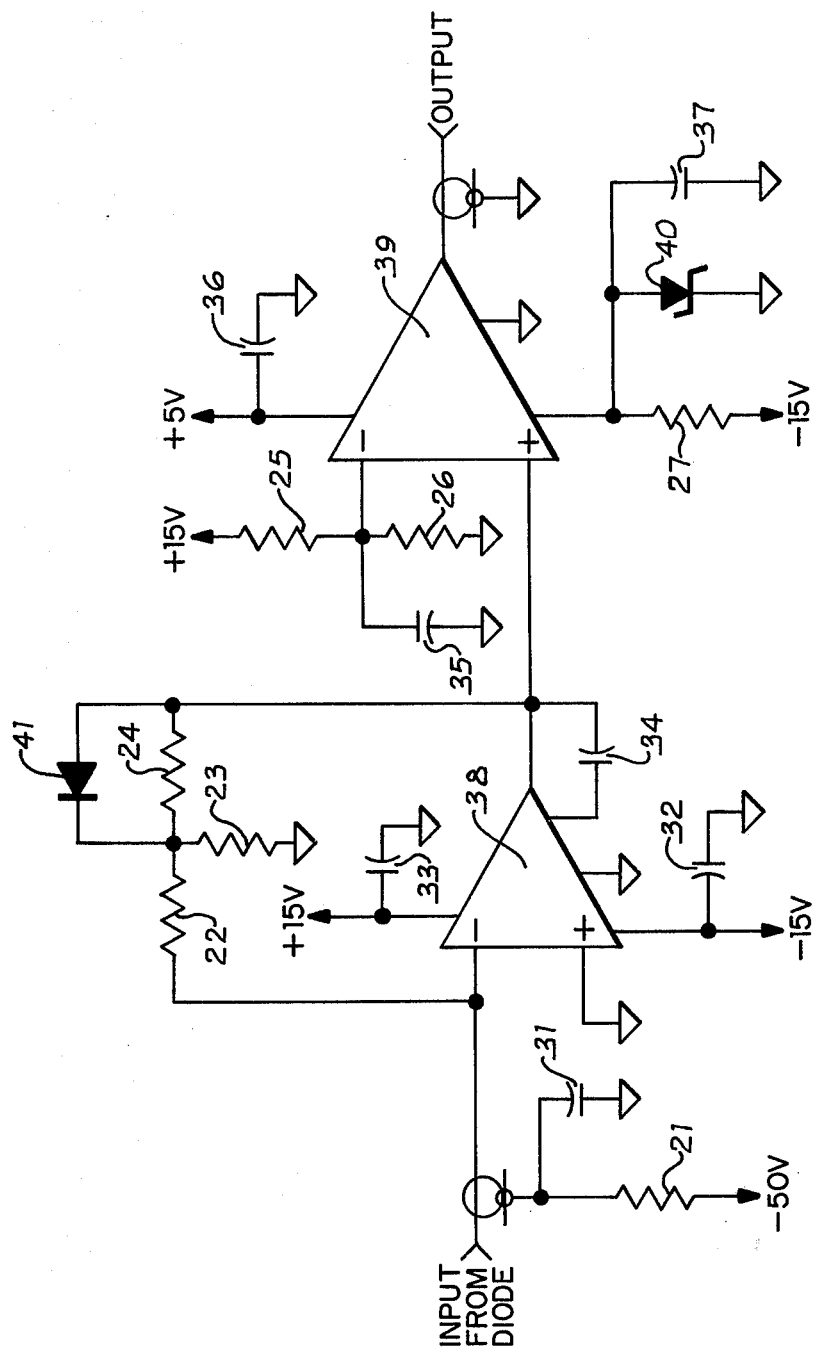
FIG. 3 is a schematic circuit diagram showing an implementation of the circuit shown in FIG. 2.

Referring now to FIG. 3 of the drawings, there is shown a DC coupled, optoelectronic receiver application which was built and tested at Naval Avionics Facility, Indianapolis, in order to demonstrate the effect of a T-network feedback circuit, as shown in FIG. 2 of the drawings. The following values were used for the components shown in FIG. 3 of the drawings, it being understood, of course, that other values might also be used:

| Resistor | 21 | 10Ω |
| --- | --- | --- |
| Resistor | 22 | 1000 Ω |
| Resistor | 23 | 20 Ω |
| Resistor | 24 | 200Ω |
| Resistor | 25 | 7.5KΩ |
| Resistor | 26 | 51Ω |
| Resistor | 27 | 510Ω |
| Capacitor | 31 | .027μf |
| Capacitor | 32 | .1μf |
| Capacitor | 33 | .1μf |
| Capacitor | 34 | 10pf |
| Capacitor | 35 | .1μf |
| Capacitor | 36 | .1μf |
| Capacitor | 37 | .1μf |

The preamplifier stage includes a wideband operational amplifier 38 and the second stage includes an analog voltage comparator 39 used to detect a preset signal threshold level. A Schottky diode clamp 41 is provided in order to limit the output swing of amplifier 38 under overload conditions. Diode clamp 41 provides improved response under overload conditions and is valuable if the input signal has a large dynamic range. The transimpedance gain of the amplifier shown in FIG. 3 is calculated to be 11K ohms. The rise time measured at the output of the operational amplifier 38 was slightly less than 50 nsecs., and the maximum data rate was 12m Bits/sec.

The T-network shown in FIG. 3 of the drawings was then replaced with an "equivalent" 11K ohms feedback resistor and a rise-time of about 220 nsecs. was measured. Additionally, the circuit was observed to be highly underdamped. The maximum observed data rate was about 3m Bits/sec. It can be seen that by using the T-network, the gain-bandwidth product of the amplifier was increased by a factor of five.

There are certain applications in which it may be desirable for a T-network to exhibit a different transfer function to DC signals than to AC signals. One method of achieving this result is shown in FIG. 4 of the drawings, wherein a capacitor 42 is placed in the shunt leg of the T-network.

Figure 5:
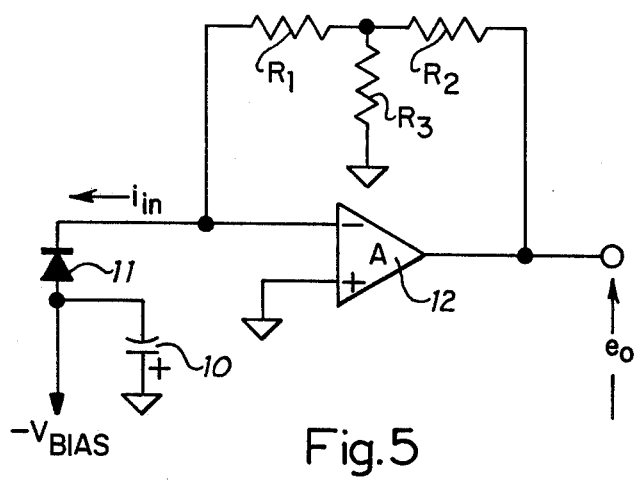
FIG. 5 is an equivalent AC circuit model for the circuit shown in FIG. 4 of the drawings.
Figure 6:
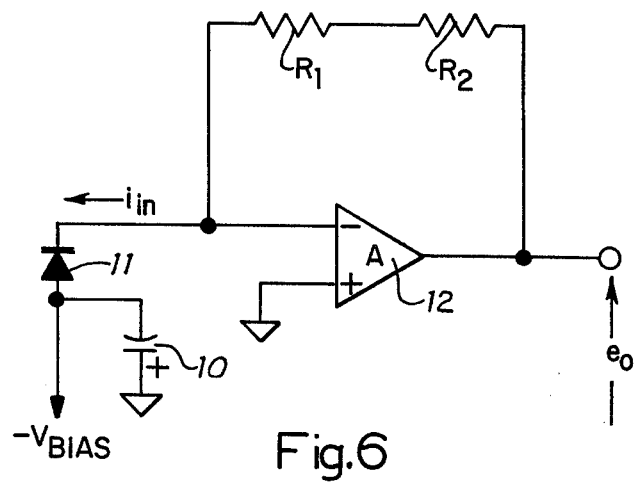
FIG. 6 is an equivalent DC circuit model for the circuit shown in FIG. 4 of the drawings.

Considering capacitor 42 as a short circuit to AC current and an open circuit to DC current, simple equivalent circuit models may be drawn for both cases. These equivalent circuits are shown in FIGS. 5 and 6 of the drawing.

Figure 4:
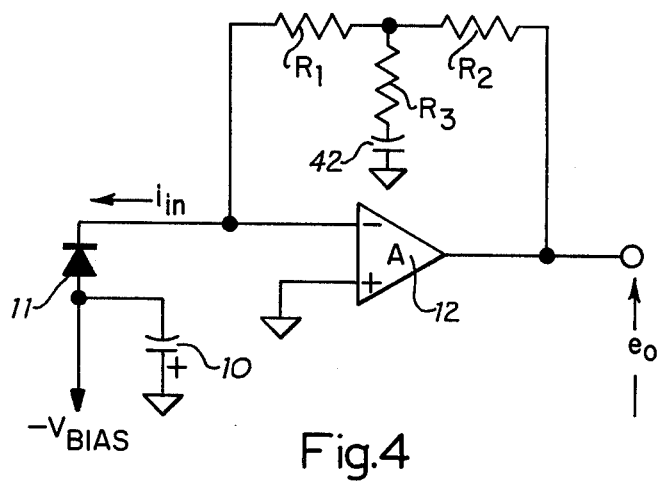
FIG. 4 is a schematic circuit diagram showing a variation of the circuit shown in FIG. 2 of the drawings.

The configuration shown in FIG. 4 of the drawings may be useful when it is desired to direct couple the amplifier to a following stage. If the transimpedance amplifier is coupled to the following stage by means of an AC coupling network, the series capacitor 42 will block the DC component of signal voltage. A major disadvantage of the AC coupling network is that it may have to be tailored for the particular bandwidth required since it does affect the frequency response of the composite amplifier. The transimpedance amplifier forces photogenerated signal current in the photodiode current source to flow through the feedback resistor $R_f$ or the equivalent resistance, $R'_f$, of a T-network thus developing a proportional voltage at the output node of the amplifier. In addition to the signal current, there are components of the current through the feedback resistance $R_f$ and $R'_f$ that are DC or steady state. This steady state current is composed of two components. One component is the "dark" current or the leakage current associated with a reverse biased photodiode that flows independent of any photon excitation. Another component is that due to the steady state bias current required for the operational amplifier at the negative input node since this current must be supplied through $R_f$ or $R'_f$.

The DC current component contributes to the voltage at the amplifier output in proportion to its magnitude. For the conventional circuit configuration with a single series feedback resistor, as shown in FIG. 1, if the DC current component and the photogenerated signal current component are equal in magnitude, the voltage at the amplifier output terminal will consist of a DC component equal to one-half the magnitude and a signal component equal to one-half the magnitude.

It is desirable to direct couple the amplifier to the following stage to avoid the frequency limiting effect of an AC coupling network. The following stage will usually be a threshold detecting amplifier which switches output state when the threshold is exceeded. For pulse processing circuits, the output of the threshold amplifier is quantized to a standard logic level to properly interface with the appropriate standard logic circuitry which follows.

In order to avoid false triggering, it is necessary that the component of the 1st stage output voltage due to the DC current component be much lower than the threshold level. The DC current component is temperature dependant, effectively doubling with each 10° C increase in temperature. Wide temperature range circuitry required in military applications must often operate at temperatures of 25° or greater. At 125° C the DC current component is approximately 1,000 times greater than it is at 25° C, the figure often used for normal room temperature. A direct coupled threshold amplifier to operate over a wide temperature range of this magnitude may not be capable of realization. Substitution of the basic T-network shown in FIG. 2 of the drawings offers improvement in amplifier bandwidth but no improvement with regard to the DC output offset voltage component. Substitution of the T-network with a capacitor in the shunt leg, as shown in FIG. 4 of the drawings, provides improved performance by providing higher gain to the signal (AC) component of feedback current than it does to the steady state (DC) component.

The signal current component is multiplied by the AC transfer function of the modified T-network as shown in FIG. 5. This is equal to $$R_f' \triangleq R_1 \left(1 + \frac{R_2}{R_1} + \frac{R_2}{R_3}\right).$$

The DC component is multiplied by the DC transfer function as shown in FIG. 6. This is equal to $$R_f'' \triangleq R_1 + R_2.$$

The improvement factor (IF) is represented by the ratio of the AC or signal gain to the DC gain.

FIG. 5 of the drawings shows an equivalent AC circuit for the transimpedance amplifier circuit shown in FIG. 4 and, in FIG. 5, $$E_o = R_f' i_{in'} \qquad (6)$$

and $$R_f' \triangleq R_1 \left(1 + \frac{R_2}{R_1} + \frac{R_2}{R_3}\right). \qquad (7)$$

Likewise, FIG. 6 of the drawings shows an equivalent DC circuit for the transimpedance amplifier circuit shown in FIG. 4 and, in FIG. 6, $$e_o = R_f' i_{in}' \tag{8}$$

and $$R_f' \triangleq R_1 + R_2. \tag{9}$$

The improvement factor (IF) is represented by the ratio of the AC or signal gain to the DC gain and, by dividing equation (7) by equation (9);

$$IF = \frac{R_1}{R_1 + R_2} \left( 1 + \frac{R_2}{R_1} + \frac{R_2}{R_3} \right). \tag{10}$$

By way of example, the receiver circuit shown in FIG. 3 of the drawings can be used to show the improvement offered by adding capacitor 42, as shown in FIG. 4 of the drawings. In FIG. 3:

$R_1$ = resistor 22 = 1,000Ω
$R_2$ = resistor 24 = 200Ω
$R_3$ = resistor 23 = 20Ω, and by using these resistance values in equation (10), $$IF = 9.33 \tag{11}$$

The effect of capacitor 42 in the shunt leg of the T-network shown in FIG. 4 of the drawings is that the DC component of current has less than 1/9 the effect of AC signal current in causing a voltage to develop at the output of the amplifier.

Obviously many modifications and variations of the present invention are possible in the light of the above teachings. For example, while the invention is described in terms of the reception of digital information since this is the most common application, it is obvious that improvement in performance applies equally as well to the reception of analog data. Also, in some applications, it is advantageous to terminate a photodiode with a low value resistor and the signal voltage generated across the resistor is amplified by means of a voltage type amplifier. The use of a T-network as a feedback element also provides improved performance in this application. Additionally, certain applications requiring a high degree of circuit isolation utilize optical coupling across a narrow air gap. As in the case of fiber optic data transmission, a light emitting source diode and a silicon photodetector diode are required. These devices are usually manufactured as a single unit called an "optical isolator". Some units have built in driver and/or receiver circuitry. The receiver amplifier design problems are quite similar to those encountered in the design of receiver amplifiers for fiber optic transmission. The bandwidth of an optoelectronic coupler could be significantly increased by use of the T-network feedback element. It is therefore to be understood that within the scope of the appended claims, the invention may be practiced otherwise than as specifically described.

We claim:
1. In an electro-optical transmission line, a receiver for converting light signals to electrical signals comprising,
   a photodiode for receiving light inputs and having an electrical input terminal and an output signal port for providing electrical signals proportional to the input of light to said photodiode,
   a source of voltage connected to said electrical input terminal for reverse biasing said photodiode,
   an amplifier having an output terminal and an input terminal connected to said output signal port of said diode, and
   a T-network feedback circuit connected between said amplifier output terminal and said input terminal for increasing transimpedance gain-bandwidth product of said amplifier.

2. In an electro-optical transmission line, a receiver for converting light signals to electrical signals as set forth in claim 1 wherein said T-network feedback circuit is comprised of first and second resistors connected in series between an output of said amplifier and an input of said amplifier, said second resistor being about five times greater in resistance value than the resistance value of said first resistor, and a third resistor lower in resistance value than the resistance value of said first resistor connected between ground potential and a point common to said first and second resistor.

3. In an electro-optical transmission line, a receiver for converting light signals to electrical signals as set forth in claim 2 wherein a capacitor is connected in series with said third resistor.

4. In an electro-optical transmission line, a receiver for converting light signals to electrical signals as set forth in claim 1 wherein said amplifier is comprised of a wideband operational amplifier having an input connected with said output signal port of said photodiode and an analog voltage comparator for detecting a preset signal threshold level from said wideband operational amplifier and wherein said T-network feedback circuit is connected between the output and the input of said wideband operational amplifier.

5. In an electro-optical transmission line, a receiver for converting light signals to electrical signals as set forth in claim 4 wherein said T-network feedback circuit is comprised of first and second resistors connected in series between an output of said wide-band operational amplifier and an input of said wideband operational amplifier, said second resistor being about five times greater in resistance value than the resistance value of said first resistor, and a third resistor lower in resistance value than the resistance value of said first resistor connected between ground potential and a point common to said first and second resistor.

6. In an electro-optical transmission line, a receiver for converting light signals to electrical signals as set forth in claim 5 wherein a capacitor is connected in series with said third resistor.

* * * * *